United States Patent [19]
Limberg

[11] Patent Number: 5,386,200
[45] Date of Patent: Jan. 31, 1995

[54] IGFET CURRENT MIRROR AMPLIFIERS WITH NESTED-CASCODE INPUT AND OUTPUT STAGES

[75] Inventor: Allen L. Limberg, Ringoes, N.J.

[73] Assignee: Samsung Electronics Co., Ltd., Kyungki, Rep. of Korea

[21] Appl. No.: 165,935

[22] Filed: Dec. 14, 1993

[51] Int. Cl.⁶ .......................... H03F 3/16; H03F 3/45
[52] U.S. Cl. .................... 330/288; 330/253; 330/257; 323/316
[58] Field of Search ............ 330/253, 257, 288; 323/315, 316

[56] References Cited

U.S. PATENT DOCUMENTS

| | | | |
|---|---|---|---|
| 4,371,844 | 2/1983 | Boeke | 330/253 |
| 4,893,090 | 1/1990 | Boudewijns | 330/253 |

FOREIGN PATENT DOCUMENTS

| | | | |
|---|---|---|---|
| 137718 | 10/1981 | Japan | 330/288 |
| 284005 | 11/1989 | Japan | 330/257 |

*Primary Examiner*—James B. Mullins
*Attorney, Agent, or Firm*—Sughrue, Mion, Zinn, Macpeak & Seas

[57] ABSTRACT

A current minor amplifier (CMA) includes first, second, third and fourth field effect transistors (FETs), all of the same conductivity type. The first and second FETs are in nested cascode connection in the CMA input stage, and the third and fourth FETs are in nested cascode connection in the CMA output stage. The drains of the second and fourth FETs respectively connect to the CMA input terminal and to the CMA output terminal, and the sources of the first and third FETs connect to the CMA common terminal. The potential at the CMA input terminal is applied to an interconnection of the gate electrodes of the first, second, third and fourth FETs to regulate current conduction through their channels, thereby to implement CMA operation. Structural differences between the first and second FETs cause the first FET source-to-gate voltage to exceed the second FET source-to-gate voltage in response to serial conduction of current through their respective channels; and similar structural differences between the third and fourth FETs cause the third FET source-to-gate voltage to exceed the fourth FET source-to-gate voltage in response to serial conduction of current through their respective channels. These structural differences can involve different dopings of the semiconductor regions in which the serially connected FET channels in each nested-cascode connection are respectively induced, or differences in the width-to-length ratios of the serially connected FET channels in each nested-cascode connection, or both such differences.

35 Claims, 4 Drawing Sheets

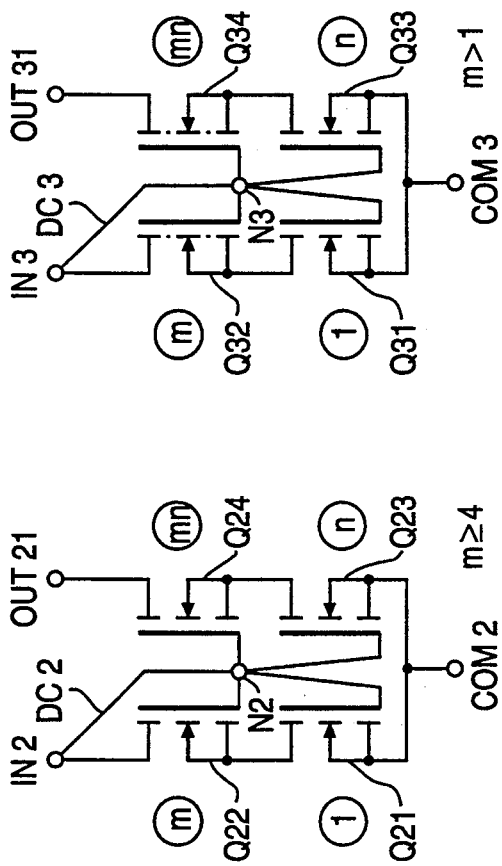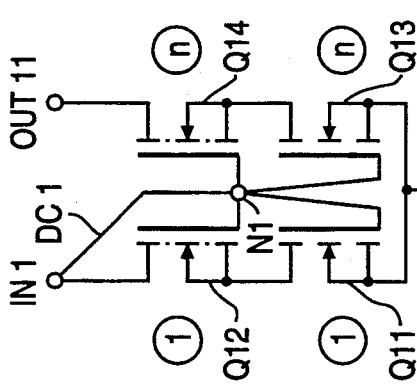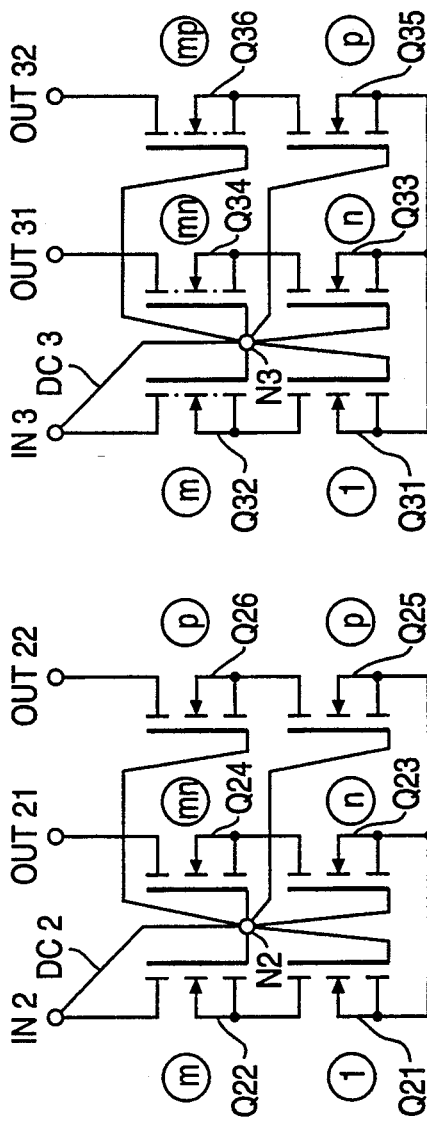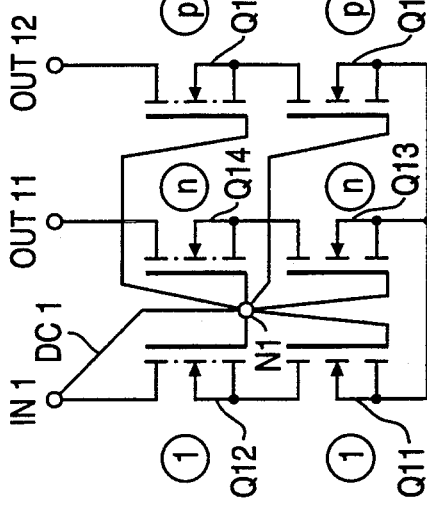

IGFET CURRENT MIRROR AMPLIFIERS WITH NESTED-CASCODE INPUT AND OUTPUT STAGES

The invention relates to current mirror amplifiers (CMAs) constructed with insulated-gate field effect transistors (IGFETs) and, more particularly, to such current mirror amplifiers constructed with nested-cascode input and output stages.

BACKGROUND OF THE INVENTION

The simplest CMA structure using IGFETs is probably the one which uses first and second similar IGFETs having respective drain electrodes respectively connected to input and output terminals for the CMA, having respective source electrodes connected to a common terminal for the CMA, and having respective gate electrodes that have a point of interconnection between them. The first IGFET is provided drain-to-gate feedback by a connection from the input terminal of the CMA to the point of interconnection between the gate electrodes of the first and second IGFETs. The IGFET is a charge-controlled device, rather than a current-controlled device like the bipolar transistor. Accordingly, there is no static feedback current error in this CMA structure using IGFETs, as contrasted to a structurally similar CMA using bipolar transistors.

In this simplest CMA structure the first IGFET is a "master" transistor, having its source-to-gate potential self-regulated by its drain-to-gate feedback connection; and the second IGFET is a "slave" transistor having its source-to-gate potential regulated together with the source-to-gate potential of the "master" transistor. The IGFET is normally more subject to Early effect than the bipolar transistor, so in a CMA using IGFETs as "master" and "slave" transistors quite often the "slave" transistor is used as the common-source amplifier transistor followed by a common-gate amplifier transistor in a cascode output stage. Even in more complex CMAs using IGFETs, though, one can identify a "master" transistor adjusted by feedback to conduct the CMA input current and a respective "slave" transistor adjusted in accordance therewith for conducting each CMA output current ratioed to the CMA input current.

The IGFETs used in CMAs are enhancement-mode transistors, so the slave IGFETs can be removed from conduction, or "cut off". The matching or ratioing of the channel current versus source-to-gate potential characteristics of the master and slave IGFETs tends to be better as the devices are made more enhancement-mode or remote-cut-off in nature. Close matching or ratioing of these characteristics is the sine qua non for good current mirror operation. As the master and slave IGFETs in a CMA are made more enhancement-mode or remote-cut-off in nature, the threshold voltage $V_T$, or source-to-gate potential required to sustain appreciable conduction through the channel, rises to at least a volt and often a few volts. In the simplest CMA structure using IGFETs, as described above, increasing $V_T$ increases the input potential between the common and input terminals that is required for CMA operation. Generally, increases in the input potential between the common and input terminals of CMAs using IGFETs as master and slave devices, in order for CMA operation to obtain, are noted as $V_T$ increases for these devices. CMA input potentials of a volt or more generally are not of major concern in IGFET integrated circuits using supply voltages of 5 volts or more, although the number of current-mode stages that can be stacked up between supply rails is reduced, tending to require additional current paths between supply rails and to cause undesirable additional power consumption. CMA input potentials of more than a volt or so cannot be tolerated in IGFET integrated circuits using lower supply voltages (e.g., of 3 volts or so). IGFET integrated circuits using supply voltages of 3 volts or less are gaining the attention of electronic designers especially for battery-powered equipment.

U.S. Pat. No. 3,953,807 issued 27 April 1976 to O. H. Schade, Jr., and entitled "CURRENT AMPLIFIER" is incorporated herein by reference. FIG. 1 of the drawing of U.S. Pat. No. 3,953,807 shows an all-IGFET current mirror amplifier, with first and second IGFETs in cascode connection with each other in the input stage, and with third and fourth IGFETs in cascode connection with each other in the output stage of the CMA. The first and third IGFETs are in common-source-amplifier connections in their respective cascode connections with their drain electrodes connecting to the source electrodes of the second and fourth IGFETs, respectively; and the gate electrodes of the first and third IGFETs are biased by direct feedback connection from the drain electrode of the first IGFET. The second and fourth IGFETs are in common-gate-amplifier connections in their respective cascode connections with their drain electrodes connecting to the CMA input terminal and to the CMA output terminal, respectively; and the gate electrodes of the second and fourth IGFETs are biased by direct feedback connection from the CMA input terminal. The input potential for this type of CMA is more than twice threshold voltage. Even with IGFETs that have $V_T$s of only one volt or so, the input potential tends to exceed two volts.

U.S. Pat. No. 3,953,807 is evidence that there has been a longfelt desire to reduce the quiescent input and output potentials required for operation of CMAs using IGFETs in their construction. FIG. 2 of the drawing of U.S. Pat. No. 3,953,807 shows a modification of the CMA of FIG. 1 in which the self-biased second IGFET is replaced by a series connection junction diodes poled for forward conduction of current. The voltage drop across this series connection of junction diodes is lower than the source-to-gate voltage ($V_{GS}$) of the self-biased IGFET, so the source follower action of the fourth IGFET places a source-to-drain ($V_{DS}$) on the third IGFET that is smaller than its $V_{GS}$. A cascode operated so the $V_{DS}$ of its common-source-amplifier transistor is less than its $V_{GS}$ is termed a "nested" cascode by transistor circuit designers. The voltage drop across this series connection of junction diodes being lower than the source-to-gate voltage ($V_{GS}$) of the self-biased IGFET results in the input voltage of this CMA with "nested" cascode output stage being reduced if the $V_T$s of the IGFETs is a few volts. With lower-$V_T$ IGFETs the series connection of junction diodes can be replaced by a single junction diode or possibly a series connection of Schottky-barrier diodes to get a CMA with input potential, only a few tenths volt more than the $V_{GS}$ of an IGFET that has a $V_T$ of only one volt or so. In certain circumstances, particularly in integrated circuits using supply voltages of 3 volts or less, it is desirable if the input potential of a CMA with "nested" cascode output stage can be still further reduced.

The CMAs with "nested" cascode output stages thusfar described are undesirable in that the bias diode(s) do not have an electrode in the substrate of an integrated circuit and so have to be fabricated in an isolated region of semiconductor. This is undesirable in certain fabrication technologies—e.g., complementary metal-oxide-semiconductor (CMOS) technology. An objective of the invention disclosed herein is to provide a CMA with IGFET nested-cascode input and output stages which CMA does not require in its construction a semiconductor junction that floats in potential respective to integrated-circuit substrate.

In FIG. 6 of the drawing of U.S. Pat. No. 3,953,807 Schade shows a CMA using IGFETs that has an input potential only a few tenths volt more than the $V_{GS}$ of an IGFET that has a $V_T$ of only one volt or so. In this CMA the gate electrodes of the first and third IGFETs are biased by direct feedback connection from the CMA input terminal. The gate electrodes of the second and fourth IGFETs are furnished a bias potential of about 1.5 $V_{GS}$ from a reference voltage circuit formed from a further IGFET in common-source-amplifier connection with drain-to-gate voltage feedback through a resistive potential divider. The bias potential of about 1.5 $V_{GS}$ appears across the input of the resistive potential divider connected between the source and drain electrodes of the further IGFET. An objective of certain embodiments of the invention disclosed herein is to provide a CMA with IGFET nested cascode input and output stages which CMA does not have to include a power-consuming reference voltage circuit or a resistive potential divider in its construction.

U.S. Pat. No. 4,260,946 issued 7 April 1981 to C. F. Wheatley, Jr., and entitled "REFERENCE VOLTAGE CIRCUIT USING NESTED DIODE MEANS" shows a cascode connection of IGFETs in which the common-source-amplifier IGFET and the common-gate-amplifier IGFET have respective channels with similar width-to-length (W/L) ratio, but have different doping of the semiconductor under their gate electrodes. Accordingly, for the same current flow through their respective channels the common-gate-amplifier IGFET has a smaller $V_{GS}$ than the common-source-amplifier IGFET has. This permits their gate electrodes to be connected together and biased by feedback from the drain electrode of the common-gate-amplifier IGFET. The feedback regulates the serial conduction, by the serially-connected channels of the IGFETs, of current applied between the source electrode of the common-source-amplifier IGFET and the drain of electrode of the common-gate-amplifier IGFET. The $V_{GS}$ of the common-gate-amplifier IGFET being smaller than the $V_{GS}$ of the common-source-amplifier IGFET provides for the common-source-amplifier IGFET having sufficient $V_{DS}$ for conduction through its channel.

In the book Analog MOS Integrated Circuits for Signal Processing, copyrighted 1986 by John Wiley & Sons, Inc., and edited R. Gregorian and G. C. Temes, subchapter 4.16 "High-Performance CMOS Op-Amps" describes circuitry for biasing IGFET cascodes. First and second bias-network IGFETs have respective channels with relatively large and relatively small W/L ratios, respectively, a 4:1 ratio being particularly described. Each of the first and second bias-network IGFETs has its source-to-gate potential $V_{GS}$ self-regulated by a respective direct drain-to-gate feedback connection without substantial intervening impedance to condition its channel for conducting a reference current, as separately applied Thereto. The first bias-network IGFET applies its $V_{GS}$ to determine the quiescent gate potential to the common-source-amplifier IGFET in the cascode as referred to its quiescent source potential, and the second bias-network IGFET applies its $V_{GS}$ to determine the quiescent gate potential of the common-gate-amplifier IGFET in the cascode, as referred to the quiescent source potential of the common-source-amplifier IGFET in the cascode.

SUMMARY OF THE INVENTION

A current mirror amplifier (CMA) embodying the invention includes first, second, third and fourth field effect transistors (FETs), all of the same conductivity type. The first and second FETs are in nested cascode connection with each other in an input stage of the CMA, and the third and fourth FETs are in nested cascode connection with each other in an output stage of the CMA. The drains of the second and fourth FETs respectively connect to the CMA input terminal and to the CMA output terminal, and the sources of the first and third FETs connect to the CMA common terminal. The potential at the CMA input terminal is applied to an interconnection of the gate electrodes of the first, second, third and fourth FETs to regulate current conduction through their channels, thereby to implement CMA operation. Structural differences between the first and second FETs cause the source-to-gate voltage of the first FET to exceed the source-to-gate voltage of the second FET in response to serial conduction of current through their respective channels; and similar structural differences between the third and fourth FETs cause the source-to-gate voltage of the third FET to exceed the source-to-gate voltage of the fourth FET in response to serial conduction of current through their respective channels. These structural differences can involve different dopings of the semiconductor regions in which the serially connected FET channels in each nested-cascode connection are respectively induced, or differences in the width-to-length ratios of the serially connected FET channels in each nested-cascode connection, or both such differences.

BRIEF DESCRIPTION OF THE DRAWING

FIG. 1 is a schematic diagram of a current mirror amplifier embodying the invention in one of its aspects.

FIG. 2 is a schematic diagram of another current mirror amplifier embodying the invention in another of its aspects.

FIG. 3 is a schematic diagram of still another current mirror amplifier embodying the invention in both of the aspects illustrated in FIGS. 1 and 2.

FIGS. 4, 5 and 6 are schematic diagrams of plural-output current mirror amplifiers embodying the invention.

FIG. 7 is a schematic diagram of a modification that can be made to any of the current mirror amplifiers shown in FIGS. 1–6 in still further embodiments of the invention.

DETAILED DESCRIPTION

Figure 8:
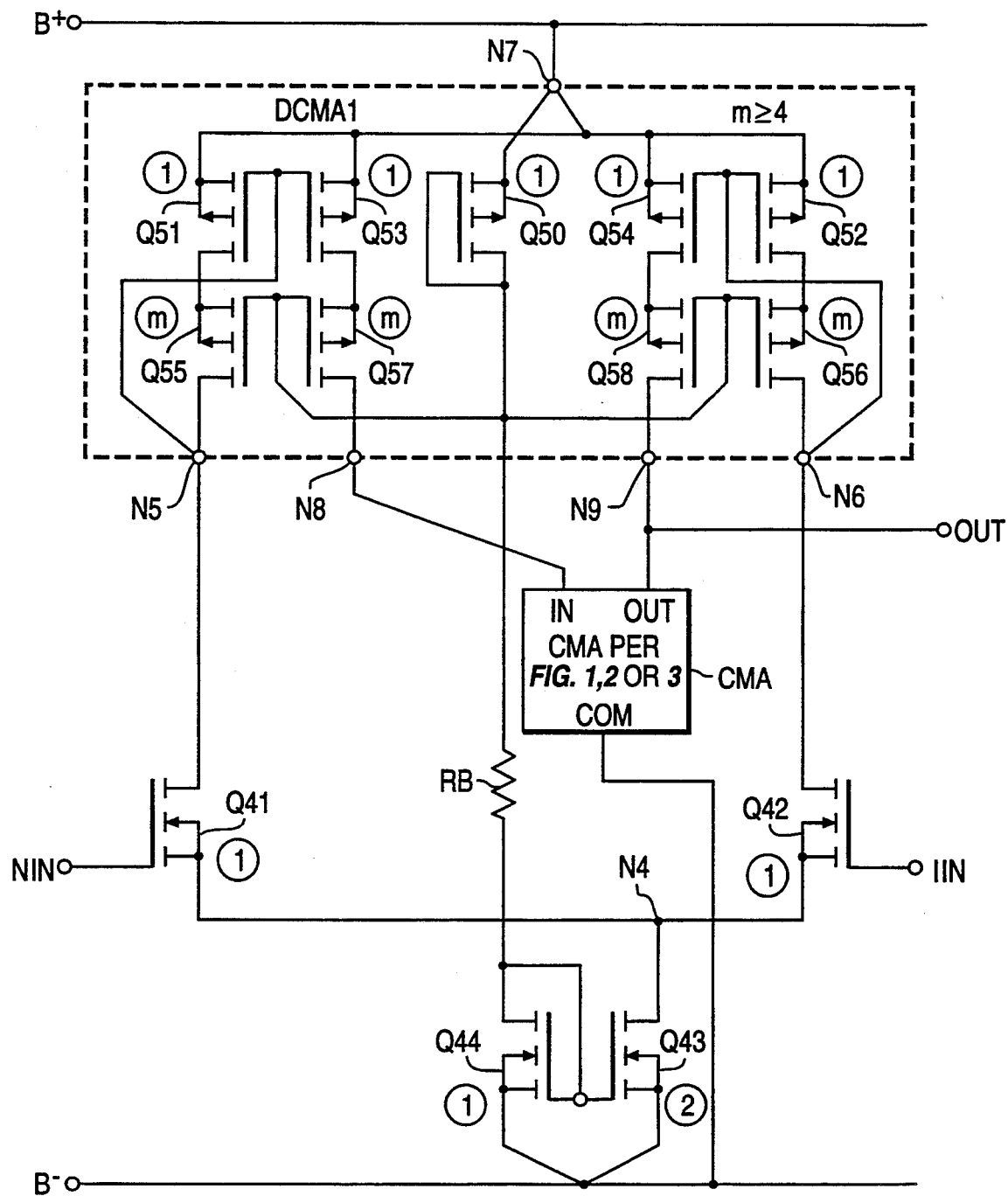
FIGS. 8, 9 and 10 are each a schematic diagram of a differential-input transconductance amplifier using IGFET mirror amplifiers with nested-cascode input and output stages.

In the following specification "m", "n" and "p" are algebraic notations of respective positive numbers, m always being larger than one. Any two of these positive numbers may be the same as each other or may be different from each other.

The FIG. 1 current mirror amplifier has an input terminal IN1, an output terminal OUT11, and a common terminal COM1. A first insulated-gate field effect transistor Q11 is the common-source-amplifier transistor of a cascode input stage, in which stage a second insulated-gate field effect transistor Q12 is the common-gate-amplifier transistor. A third insulated-gate field effect transistor Q13 is the common-source-amplifier transistor of a cascode output stage, in which stage a fourth insulated-gate field effect transistor Q14 is the common-gate-amplifier transistor. The gate electrodes of IGFETs Q11, Q12, Q13 and Q14 connect at an node N1. In operation, an input potential appears at the input terminal IN1 responsive to input current flow into the input terminal IN1, through the serially connected channels of Q11 and Q12, and out of the common terminal COM1. This input potential is applied to node N1 via a direct connection DC1 without substantial intervening impedance.

The IGFETs Q11 and Q12 have respective channels with the same width-to-length (W/L) ratio as each other. The IGFETs Q13 and Q14 have respective channels with the same W/L ratio as each other, which is n times larger than the W/L ratio of the IGFETs Q11 and Q12. The 1:1:n:n relationship of the W/L ratios of the channels of the IGFETs Q11, Q12, Q13 and Q14 is indicated by the encircled 1's and n's near them. The 1:n ratio between the W/L ratios of the channels of the first IGFET Q11 and the third IGFET Q13 determines the current gain of the FIG. 1 CMA as between the input terminal IN1 and the output terminal OUT11 being −n. Thus, the IGFETs Q11 and Q13 are the master and slave transistors, respectively, of the FIG. 1 CMA. The total current through the common terminal COM1 is the sum of the input current flowing through the input terminal IN1 and the output current flowing through the output terminal OUT11, so the total current through the common terminal COM1 is (n+1) times the input current flowing through the input terminal IN1.

IGFETs Q11 and Q12 are arranged in a reference voltage circuit using nested diode means as described by C. F. Wheatley, Jr., in U.S. Pat. No. 4,260,946, which nested diode means is used to bias the cascode connection of IGFETs Q13 and Q14 in accordance with an aspect of the invention herein disclosed. IGFETs Q11 and Q12 have identical physical dimensions and are essentially identical in all respects except for the doping of the semiconductor under their respective gate electrodes. These dopings are chosen such that the threshold value $V_T$ of source-to-gate voltage required for IGFET Q11 to reach a prescribed degree of drain-to-source current conduction is more positive than that of IGFET Q12. FIG. 1 shows IGFET Q11 as a metal-oxide-semiconductor (MOS) transistor with relatively more pronounced enhancement-mode characteristics (as indicated by the use of the standard enhancement-mode FET symbol) and IGFET Q12 as an MOS transistor with relatively less pronounced enhancement-mode characteristics (as indicated by the symbol introduced by Wheatley in U.S. Pat. No. 4,260,946 with dashes between the substrate electrode and each of the source and drain electrodes). That is, IGFET Q11 has a higher source-to-gate voltage $V_{GS}$ than IGFET Q12 for a given drain-to-source current $I_{DS}$. In the source-following operation of IGFET Q12 its lower $V_{GS}$ subtracts from the higher $V_{GS}$ of IGFET Q11 to provide IGFET Q11 the positive source-to-drain voltage $V_{DS}$ it requires for conduction, preferably for its saturated conduction. It is known to those skilled in the art of integrated FET circuit design that the difference between the source-to-gate potentials of transistors essentially identical in all respects except for the doping of the semiconductor under their gate electrodes remains constant so long as their operating temperatures are the same and their drain-to-source currents are equal. (One is referred, for example. to U.S. Pat. No. 4,068,134 entitled "BARRIER HEIGHT VOLTAGE REFERENCE" issued 10 January 1978 to Tobey, Jr., et al.)

IGFETs Q13 and Q14 have identical physical dimensions and are essentially identical in all respects except for the doping of the semiconductor under their respective gate electrodes. The doping of the semiconductor under the gate electrode of IGFET Q13 is the same as that under the gate electrode of IGFET Q11, and the doping of the semiconductor under the gate electrode of IGFET Q14 is the same as that under the gate electrode of IGFET Q12. Accordingly, the $V_T$ or IGFET Q13 exceeds that of IGFET Q14 by the same amount as the $V_T$ of IGFET Q11 exceeds that of IGFET Q12. In the source-following operation of IGFET Q14, its lower $V_{GS}$ subtracts from the higher $V_{GS}$ of IGFET Q13 to provide IGFET Q13 the positive source-to-drain voltage $V_{DS}$ it requires for conduction, preferably for its saturated conduction.

The FIG. 2 current mirror amplifier has an input terminal IN2, an output terminal OUT21, and a common terminal COM2. A first insulated-gate field effect transistor Q21 is the common-source-amplifier transistor of a cascode input stage, in which stage a second insulated-gate field effect transistor Q22 is the common-gate-amplifier transistor. A third insulated-gate field effect transistor Q23 is the common-source-amplifier transistor of a cascode output stage, in which stage a fourth insulated-gate field effect transistor Q14 is the common-gate-amplifier transistor. The gate electrodes of IGFETs Q21, Q22, Q23 and Q24 connect at an node N2. In operation, an input potential appears at the input terminal IN2 responsive to input current flow into the input terminal IN2, through the serially connected channels of Q21 and Q22, and out of the common terminal COM2. This input potential is applied to node N2 via a direct connection DC2 without substantial intervening impedance.

The IGFETs Q21, Q22, Q23 and Q24 in the FIG. 2 CMA differ from the IGFETs Q11, Q12, Q13 and Q14 in the FIG. 1 CMA. All the IGFETs Q21, Q22, Q23 and Q24 have semiconductor with the same doping under their gate electrodes in the regions wherein their channels form, so the same barrier height determines their $V_T$s. The W/L ratio of the channel of the second IGFET Q22 is larger than the W/L ratio of the channel of the first IGFET Q21 by a factor m larger than unity, as indicated by the encircled m and 1 near their respective channels. The W/L ratio of the channel of the fourth IGFET Q24 is larger than the W/L ratio of the channel of the third IGFET Q23 by the factor m also, as indicated by the encircled m n and n near their respective channels.

The W/L ratio of the channel of the first IGFET Q21 is related to the W/L ratio of the channel of the third IGFET Q23 in 1:n ratio, as indicated by the encircled 1 and n near their respective channels. This 1:n ratio between the W/L ratios of the channels of the first IGFET Q21 and the third IGFET Q23 determines the current gain of the FIG. 2 CMA as between the input terminal IN2 and the output terminal OUT21 being $-n$. Thus, the IGFETs Q21 and Q23 are the master and slave transistors, respectively, of the FIG. 2 CMA. The total current through the common terminal COM2 is $(n+1)$ times the input current flowing through the input terminal IN2.

The FIG. 3 current mirror amplifier has an input terminal IN3, an output terminal OUT31, and a common terminal COM3. A first insulated-gate field effect transistor Q31 is the common-source-amplifier transistor of a cascode input stage, in which stage a second insulated-gate field effect transistor Q32 is the common-gate-amplifier transistor. A third insulated-gate field effect transistor Q33 is the common-source-amplifier transistor of a cascode output stage, in which stage a fourth insulated-gate field effect transistor Q34 is the common-gate-amplifier transistor. The gate electrodes of IGFETs Q31, Q32, Q33 and Q34 connect at an node N3. In operation, an input potential appears at the input terminal IN3 responsive to input current flow into the input terminal IN3, through the serially connected channels of Q31 and Q32, and out of the common terminal COM3. This input potential is applied to node N3 via a direct connection DC3 without substantial intervening impedance.

The W/L ratio of the channel of the first IGFET Q31 is related to the W/L ratio of the channel of the third IGFET Q33 in 1:n ratio, as indicated by the encircled 1 and n near their respective channels. This 1:n ratio between the W/L ratios of the channels of the first IGFET Q31 and the third IGFET Q33 determines the current gain of the FIG. 3 CMA as between the input terminal IN3 and the output terminal OUT31 being $-n$. Thus the IGFETs Q31 and Q33 are the master and slave transistors, respectively, of the FIG. 3 CMA. The total current through the common terminal COM3 is $(n+1)$ times the input current flowing through the input terminal IN3.

The W/L ratio of the channel of the second IGFET Q32 is larger than the W/L ratio of the channel of the first IGFET Q31 by a factor m larger than unity, as indicated by the encircled m and 1 near their respective channels. The W/L ratio of the channel of the fourth IGFET Q34 is larger than the W/L ratio of the channel of the third IGFET Q33 by the factor m also, as indicated by the encircled mn and n near their respective channels. Additionally, the doping of the semiconductor under the gate electrodes of IGFETs Q31 and Q33 is such respective to the doping of the semiconductor under the gate electrodes of IGFETs Q32 and Q34 that the $V_{GS}$'s of IGFETs Q31 and Q33 are increased respective to the $V_{GS}$'s of IGFETs Q32 and Q34, respectively, by similar amounts that are in addition to the increases provided for by the W/L ratios of the channels of IGFETs Q31 and Q33 being smaller by the factor m than the W/L ratios of the channels of IGFETs Q32 and Q34, respectively.

The FIG. 4 plural-output current minor amplifier is a modification of the FIG. 1 CMA which has another output terminal OUT12 served by a second nested-cascode output stage comprising a fifth IGFET Q15 and a sixth IGFET Q16. The W/L ratio of the channel of the sixth IGFET Q16 is the same as the W/L ratio of the channel of the fifth IGFET Q15, as indicated by the encircled p's near their respective channels. The W/L ratio of the channel of the fifth IGFET Q15 is related to the W/L ratio of the channel of the first IGFET Q11 in 1:p ratio, as indicated by the encircled 1 and p near their respective channels. The 1:n:p ratio between the W/L ratios of the channels of the first IGFET Q11, the third IGFET Q13 and the fifth IGFET Q15 determines the current gains of the FIG. 4 CMA, as being $-n$ between the input terminal IN1 and the output terminal OUT11, and as being $-p$ between the input terminal IN3 and the output terminal OUT12. Thus the IGFETs Q11, Q13 and Q15 are respectively the master transistor, the first slave transistor and the second slave transistor of the FIG. 4 CMA. The total current through the common terminal COM1 is $(p+n+1)$ times the input current flowing through the input terminal IN1.

The FIG. 5 plural-output current mirror amplifier is a modification of the FIG. 2 CMA which has another output terminal OUT22 served by a second nested-cascode output stage comprising a fifth IGFET Q25 and a sixth IGFET Q26. The W/L ratio of the channel of the fifth IGFET Q25 is related to the W/L ratio of the channel of the first IGFET Q21 in 1:p ratio, as indicated by the encircled 1 and p near their respective channels. The 1:n:p ratio between the W/L ratios of the channels of the first IGFET Q21, the third IGFET Q23 and the fifth IGFET Q25 determines the current gains of the FIG. 5 CMA, as being $-n$ between the input terminal IN2 and the output terminal OUT21, and as being $-p$ between the input terminal IN2 and the output terminal OUT22. Thus, the IGFETs Q21, Q23 and Q25 are respectively the master transistor, the first slave transistor and the second slave transistor of the FIG. 5 CMA. The total current through the common terminal COM2 is $(p+n+1)$ times the input current flowing through the input terminal IN2. The W/L ratio of the channel of the sixth IGFET Q26 is larger than the W/L ratio of the channel of the fifth IGFET Q25 by the factor m, as indicated by the encircled mp and p near their respective channels, which makes the $V_{GS}$ of the sixth IGFET Q26 smaller than the $V_{GS}$ of the fifth IGFET Q25.

The FIG. 6 plural-output current mirror amplifier is a modification of the FIG. 3 CMA which has another output terminal OUT32 served by a second nested-cascode output stage comprising a fifth IGFET Q35 and a sixth IGFET Q36. The W/L ratio of the channel of the fifth IGFET Q35 is related to the W/L ratio of the channel of the first IGFET Q31 in 1:p ratio, as indicated by the encircled 1 and p near their respective channels. The 1:n:p ratio between the W/L ratios of the channels of the first IGFET Q31, the third IGFET Q33 and the fifth IGFET Q35 determines the current gains of the FIG. 6 CMA, as being $-n$ between the input terminal IN3 and the output terminal OUT31, and as being $-p$ between the input terminal IN3 and the output terminal OUT32. Thus the IGFETs Q31, Q33 and Q35 are respectively the master transistor, the first slave transistor and the second slave transistor of the FIG. 6 CMA. The total current through the common terminal COM3 is $(p+n+1)$ times the input current flowing through the input terminal IN2. The W/L ratio of the channel of the sixth IGFET Q36 is larger than the W/L ratio of the channel of the fifth IGFET Q35 by the factor m, as indicated by the encircled mp and p near their respective channels, which makes the $V_{GS}$ of the sixth IGFET Q36 smaller than the $V_{GS}$ of the fifth IGFET Q35. Additionally, the doping of the semiconductor under the gate electrode of the fifth IGFET Q35 is the same as that under the gate electrodes of IGFETs Q31 and Q33, and the doping of the semiconductor under the gate electrode of the sixth IGFET Q36 is the same as the doping of the semiconductor under the gate electrodes of IGFETs Q32 and Q34. This makes the $V_{GS}$ of IGFET Q36 still smaller than the $V_{GS}$ of IGFET Q31 to increase the $V_{DS}$ of IGFET Q35 to be the same as the $V_{DS}$ of IGFET Q31 and to maintain the current gain between the input terminal IN3 and the output terminal OUT32 more closely at the value −p despite Early effect in IGFETs Q31 and Q35.

Each of the plural-output CMAs of FIGS. 4–6 can be further modified to include more nested-cascode output stages. While the IGFETs in the CMAs of FIGS. 1–6 are shown as n-channel type, similar CMAs can be constructed using p-channel type IGFETs instead.

FIG. 7 shows source-follower circuitry that can replace the direct connection DC1 between the input terminal IN1 and the gate-interconnection node N1 in the FIG. 1 or FIG. 4 CMA, the direct connection DC2 between the input terminal IN2 and the gate-interconnection node N2 in the FIG. 2 or FIG. 5 CMA, or the direct connection DC3 between the input terminal IN3 and the gate-interconnection node N3 in the FIG. 3 or FIG. 6 CMA. A further IGFET QSF is connected at its gate electrode to a terminal IN corresponding to one of the input terminals IN1, IN2, IN3 and at its source electrode to a gate-interconnection node N corresponding to one of the gate-interconnection nodes N1, N2, N3. The drain electrode of IGFET QSF is connected at a terminal B+ to receive a positive operating potential, and the source electrode of IGFET QSF is connected through a source load resistor R to a terminal B− for receiving a negative operating potential. The source load resistor R provides a means for more rapidly discharging the capacitance at the gate-interconnection node N when the CMA has to have very fast current turn-off capability. The increase in the input potential of the CMA can be reduced by doping the semiconductor under the gate electrode of the source-follower IGFET QSF, in which the channel is induced, to cause IGFET QSF to be a depletion-mode device or a reduced-$V_T$ enhancement-mode device. There are also zero-offset voltage-follower circuits known in the art that can replace the source-follower in still further CMAs embodying the priniciples of the invention.

Dual-output CMAs as shown in FIGS. 4–6 and as modified per FIG. 7 can have their output terminals connected for providing respective constant-current loads to the drains of a differential-amplifier pair of IGFETS of conductivity type complementary to that of the CMA IGFETs. In such instance m and p will be chosen to be equal. CMAs in which m and p are both chosen to be one are also of particular interest for use in specific applications.

FIG. 8 shows a differential-input transconductance amplifier that uses one of the CMAs of FIGS. 1–3 as a balanced-to-single-ended converter. The terminals B− and B+ of the FIG. 8 differential-input transconductance amplifier are for connecting its negative and positive operating supply voltage rails to the negative and positive terminals of an operating supply of three volts or so. The FIG. 8 differential-input transconductance amplifier has a non-inverting input terminal NIN and an inverting input terminal IIN at the respective gate electrodes of a source-coupled differential-amplifier pair of p-channel IGFETs Q41 and Q42. Q41 and Q42 are arranged in long-tailed pair connection, with a constant current being drawn from a node N4 at the tail connection between their respective source electrodes. This current is withdrawn to the drain electrode of another p-channel IGFET Q43 having its source electrode connected to the negative rail and having its gate electrode forward biased by the source-to-drain potential of still another p-channel IGFET Q44, which is diode-connected by direction connection of its drain electrode to its gate electrode. Q43 and Q44 form a simple CMA with a current gain of two, as between the current flowing to the diode-connected IGFET Q44 through a bleeder resistor RB and the tail current drawn from the node N4 to the drain electrode of Q43. The gain of two is established by the W/L ratio of Q43 being made twice that of Q44, usually by making the channel of Q43 twice as wide as that of a Q44 with similar length channel. This relationship is indicated in FIG. 8 by the encircled "two" near the source electrode of Q43 and the encircled "one" near the source electrode of Q44. The current flow through the bleeder resistor RB is established in accordance with Ohm's Law. That is, the voltage across the resistor RB, which is equal to the 3 volt or so operating voltage applied between the terminals B− and B+ less the drops across the diode-connected p-channel IGFET Q44 and a diode-connected n-channel IGFET Q50, is divided by the resistance of the resistor R B to determine the current flow therethrough.

The drain currents of Q41 and Q42 are withdrawn as first and second input currents from respective input connections of a dual-input, dual-output current mirror amplifier DCMA1 at nodes N5 and N6. Node N7 is its common connection to the positive operating voltage rail. The dual-input, dual-output current mirror amplifier DCMA1 supplies first and second output currents respectively responsive to its first and second output currents. These first and second output currents are respectively supplied through an output connection at node N8 to the input connection of a current mirror amplier CMA and through an output connection at node N9 to the output terminal OUT of the FIG. 8 differential-input transconductance amplifier, respectively. The current mirror amplier CMA has its common connection to the negative operating voltage rail and has its output connection to the output terminal OUT of the FIG. 8 differential-input transconductance amplifier. The current mirror amplier CMA is one of the types shown in FIGS. 1, 2 and 3 in which n is one.

The dual-input, dual-output current mirror amplifier DCMA1 is constructed from enhancement-mode p-channel IGFETs Q50, Q51, Q52, Q53, Q54, Q55, Q56, Q57, Q58 and Q59, in accordance with the precepts of the invention. The diode-connected Q50, the master transistors Q51 and Q52, and the slave transistors Q53 and Q54 have similar W/L ratios, as indicated by the encircled "one" near each of their source electrodes. The master transistors Q51 and Q52 are each connected in common-source amplifier conguration and are cascoded with Q55 and Q56, respectively, Q55 and Q56 each being connected in common-gate amplifier configuration. The slave transistors Q53 and Q54 are each connected in common-source amplifier configuration and are cascoded with Q57 and Q58, respectively. Q57 and Q58 each being connected in common-gate amplifier configuration. Anode N18 to which the gate electrodes of Q55, Q56, Q57 and Q58 each connect is offset in potential from the positive operating voltage B+ rail by the drop across the channel of the diode-connected Q50. Q55, Q56, Q57 and Q58 have similar W/L ratios, as indicated by the encircled "m" near each of their source electrodes; and m is four or more so that the source-to-gate offset voltage of Q55, Q56, Q57 and Q58 is enough less than the source-to-gate offset voltage of Q50 that Q51, Q52, Q53 and Q54 are afforded sufficient source-to-drain voltage for their nested-cascode operation with Q55, Q56, Q57 and Q58.

There is a feedback connection from the one of the input connections of the CMA DCMA1 at the node N5 to the gate electrode of the master transistor Q51. This feedback connection conditions the nested-cascode connection of Q51 and Q55 to supply the drain current demanded by Q41 from the node N5, that current being supplied from the drain electrode of Q55 to the node N5. The source-to-gate potential established for the master transistor Q51 by this feedback connection, so that Q51 and its cascoded common-gate amplifier transistor Q55 conduct the drain current demanded by Q41, is applied as source-to-gate potential for the slave transistor Q53, conditioning Q53 and its cascoded common-gate amplifier transistor Q57 to supply from the drain electrode of Q57 to the node N8 a current of the same amplitude as the drain current demanded by Q41.

There is also a feedback connection from the other of the input connections of the CMA DCMA1 at the node N6 to the gate electrode of the master transistor Q52. This feedback connection conditions the nested-cascode connection of Q52 and Q56 to supply the drain current demanded by Q42 from the node N6, that current being supplied from the drain electrode of Q56 to the node N6. The source-to-gate potential established for the master transistor Q52 by this feedback connection, so that Q52 and its cascoded common-gate amplifier transistor Q56 conduct the drain current demanded by Q42, is applied as source-to-gate potential for the slave transistor Q54, conditioning Q54 and its cascoded common-gate amplifier transistor Q58 to supply from the drain electrode of Q58 to the node N6 a current of the same amplitude as the drain current demanded by Q42.

When the input voltages applied to the terminals NIN and IIN are equal, the drain currents demanded by Q41 and by Q42 are nominally equal. The dual-input, dual-output current mirror amplifier DCMA1 responds to these nominally equal current demands on the nodes N5 and N6 that are its input connections to supply nominally equal currents from the nodes N8 and N9 that are its output connections. The current supplied from the node N8 by the current mirror amplifier DCMA1 to the input connection of the current mirror amplifier CMA conditions it to demand a current of similar amplitude at its output connection, to sink the current supplied from the node N9 by the current mirror amplifier DCMA1. The potential at the terminal OUT of the differential-input transconductance amplifier, which connects to a first terminal of a two-terminal resistive load (not shown in FIG. 8), will be determined by the potential applied to the second terminal of that resistive load.

In an alternative resistive loading arrangement, a resistive potential divider is formed from a pair of resistors having their respective first ends connected together at the terminal OUT of the differential-input transconductance amplifier and having their respective second ends respectively to the positive operating potential B+ rail and to the negative operating potential B− rail. The direct bias potential at the terminal OUT of the differential-input transconductance amplifier is substantially the same as that potential that would be established by the resistive potential divider if the terminal OUT were disconnected from the interconnected first ends of the pair of resistors forming the resistive potential divider.

Input signal voltage between the the terminals NIN and IIN will unbalance the drain currents demanded by Q41 and by Q42 and will cause corresponding unbalance in the output currents the dual-input, dual-output current mirror amplifier DCMA1 supplies from the nodes N8 and N9. The current mirror amplifier CMA forces the difference of the output currents the current mirror amplifier DCMA1 supplies from its nodes N8 and N9 to flow through the terminal OUT of the differential-input transconductance amplifier and the two-terminal resistive load (not shown in FIG. 8) to which the terminal OUT connects.

The simple current mirror amplifier connection of Q43 and Q44 permits the drain potential of Q43 to be only two tenths of a volt or so above the B− negative operating supply voltage. So the gate electrodes of Q41 and Q42 can be biased to a quiescent voltage as low as only about two tenths of a volt more than source-to-gate offset potential, as referred to the B− negative operating supply voltage. This permits their drain potentials to be as low as only about four tenths of a volt more than source-to-gate offset potential, as referred to the B− negative operating supply voltage. The nodes N5 and N6 are offset from the B+ positive operating supply voltage by only a source-to-gate offset potential. Supposing threshold voltages are about one volt, 3-volt operation of Q41 and Q42, the nested-cascode connection of Q51 and Q55, and the nested-cascode connection of Q52 and Q56 is feasible. The nested-cascode connection of Q53 and Q57 and the nested-cascode connection of the master transistor of the current mirror amplifier CMA with its common-gate amplifier transistor, which are in series connection, can operate satisfactorily from a 3-volt B supply. The nested-cascode connection of Q54 and Q58 and the nested-cascode connection of the slave transistor of the current mirror amplifier CMA with its common-gate amplifier transistor, which are in series connection, can operate satisfactorily from a 3-volt B supply. Output swing can be within four tenths volt or so of the B− negative operating supply voltage without affecting the current mirror action of CMA in any appreciable way, or can be within four tenths volt or so of the B+ positive operating supply voltage without affecting the current mirror action of DCMA1 in any appreciable way. Larger swings over most of the 3-volt B supply range are possible, with some compromises in linearity and speed of response.

Figure 9:
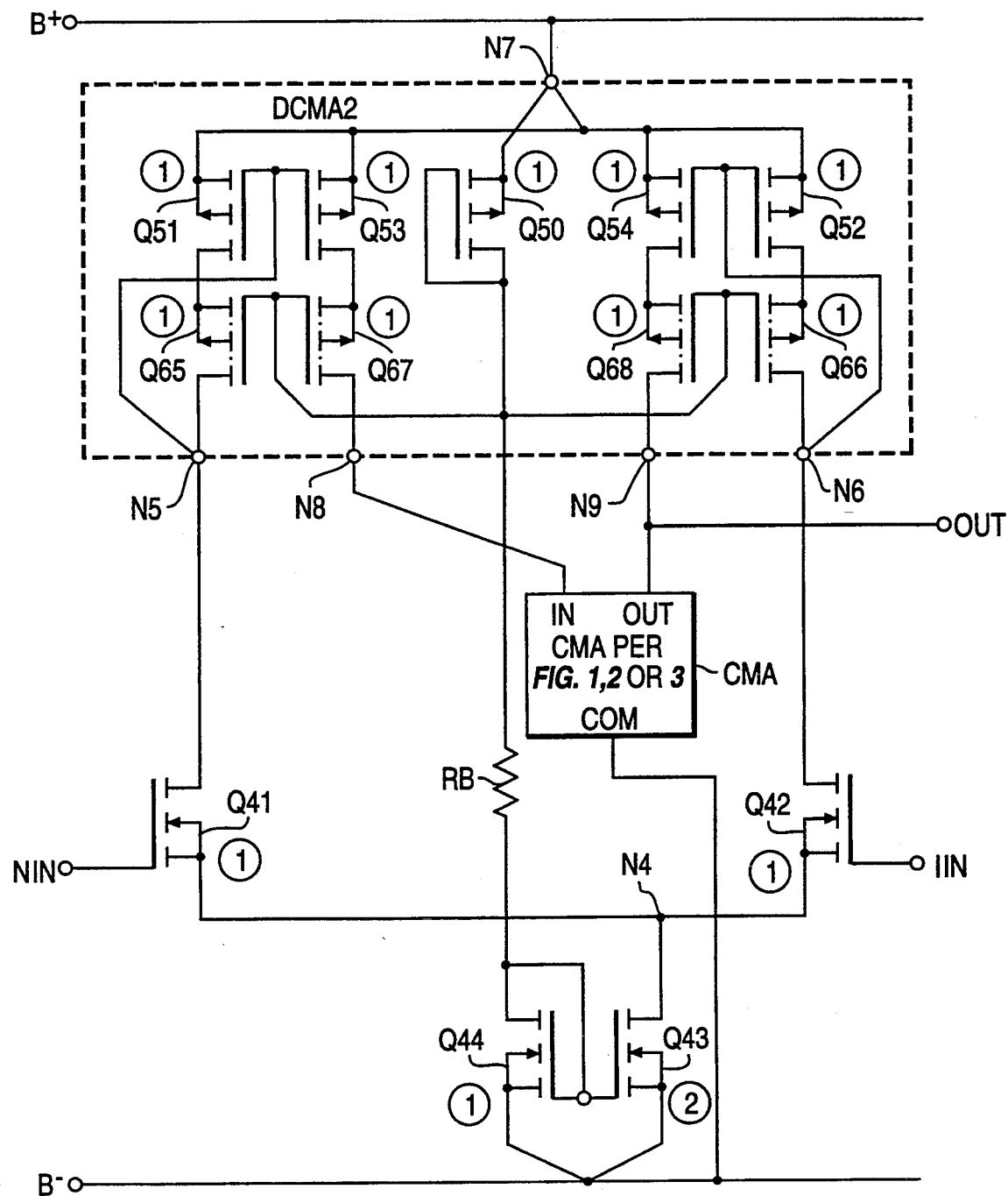

FIG. 9 shows a differential-input transconductance amplifier similar to that of FIG. 8, except that the dual-input, dual-output current mirror amplifier DCMA1 is replaced by a dual-input, dual-output current mirror amplifier DCMA2. The dual-input, dual-output current mirror amplifier DCMA2 in FIG. 9 differs from current mirror amplifier DCMA1 in FIG. 8, in that the common-gate-amplifier transistors Q55, Q56, Q57 and Q58 are replaced by common-gate-amplifier transistors Q65, Q66, Q67 and Q68, Q65, Q66, Q67 and Q68 have similar W/L ratios to each other, to the diode-connected Q50, to the master transistors Q51 and Q52, and to the slave transistors Q53 and Q54, as indicated by the encircled "one" near each of their source electrodes. The doping of the semiconductor under the gate electrodes of Q65, Q66, Q67 and Q68 differs from that under the gate electrodes of Q50, Q51, Q52, Q53 and Q54. This is done so that the source-to-gate offset voltage of Q65, Q66, Q67 and Q68 is enough less than the source-to-gate offset voltage of Q50 that Q51, Q52, Q53 and Q54 are afforded sufficient source-to-drain voltage for their nested-cascode operation with Q65, Q66, Q67 and Q68.

Figure 10:
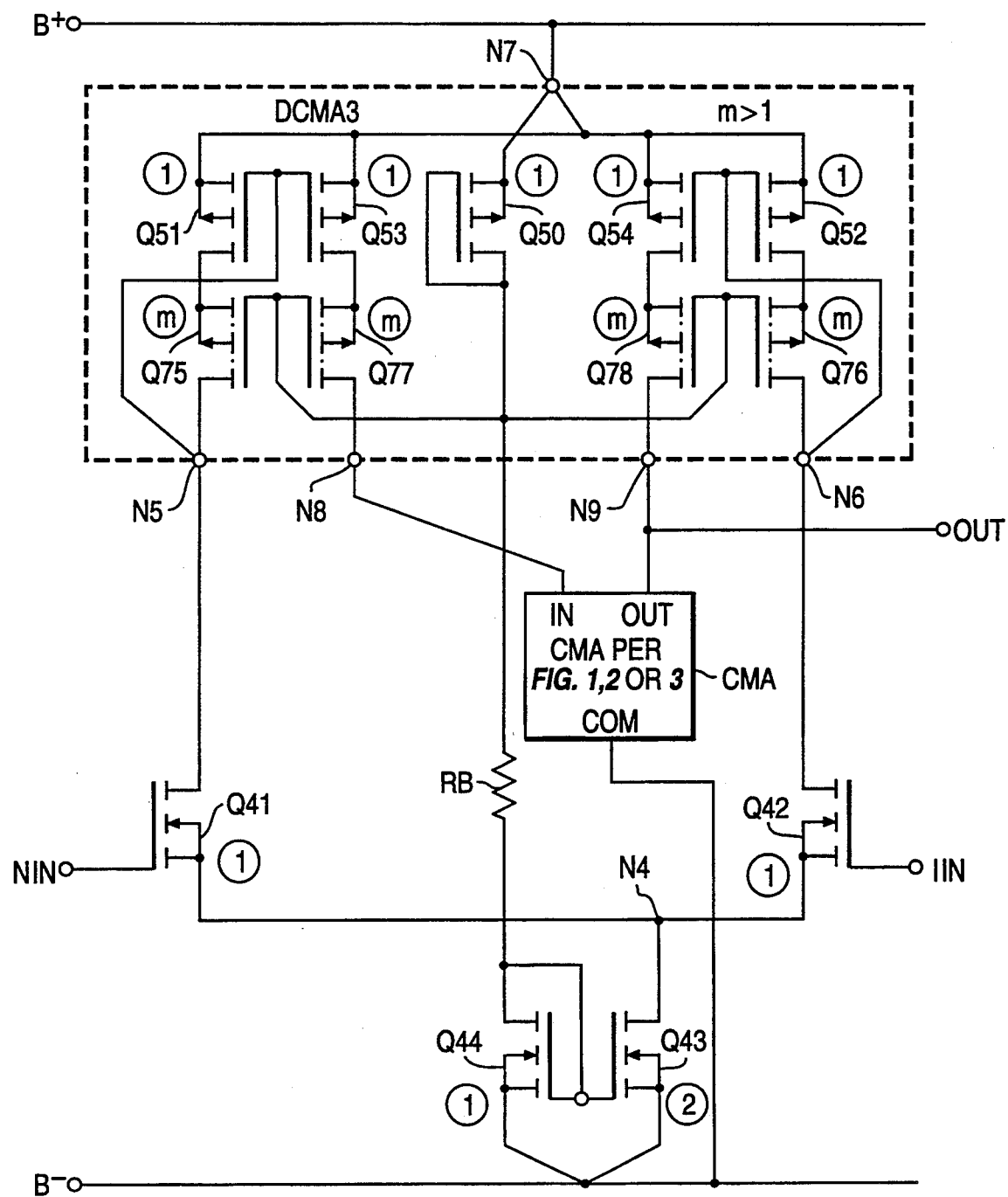

FIG. 10 shows a differential-input transconductance amplifier similar to that of FIG. 8, except that the dual-input, dual-output current mirror amplifier DCMA1 is replaced by a dual-input, dual-output current mirror amplifier DCMA3. The current mirror amplifier DCMA3 in FIG. 10 differs from current mirror amplifier DCMA1 in FIG. 8 in that the common-gate-amplifier transistors Q55, Q56, Q57 and Q58 are replaced by common-gate-amplifier transistors Q75, Q76, Q77 and Q78, Q75, Q76, Q77 and Q78 have the same W/L, ratio which, as indicated by the encircled "m" near each of their source electrodes, is larger by a factor m than the W/L ratio of Q50, Q51, Q52, Q53 and Q54. The doping of the semiconductor under the gate electrodes of Q75, Q76, Q77 and Q78 differs from that under the gate electrodes of Q50, Q51, Q52, Q53 and Q54. This is done so that the source-to-gate offset voltage of Q75, Q76, Q77 and Q78 is more reduced respective to the source-to-gate offset voltage of Q50, better to afford Q51, Q52, Q53 and Q54 sufficient source-to-drain voltage for their nested-cascode operation with Q75, Q76, Q77 and Q78.

The differential-input transconductance amplifiers of FIGS. 8, 9 and 10 can be modified to permit operation as transconductance multipliers or as synchronous detectors. This is done by disconnecting the gate electrode of Q43 from the diode-connected Q44 and arranging for the gate electrode of Q43 to receive a modulated voltage, as can be developed by Q43 being the slave transistor in a current-mirror-amplifier configuration with another p-channel IGFET serving as master transistor rather than Q44.

The dual-input, dual-output current mirror amplifiers DCMA1, DCMA2 and DCMA3 can each be modified by scaling the W/L ratios of the transistors in the nested-cascode connections of its output circuits to be p times as large as the W/L ratios of the transistors in the nested-cascode connections of its input circuits, p being a positive number usually a few-times multiple of one. This will cause each of its output currents to exhibit current gain of −p respective to one of its input currents, rather than a current gain of −1. Dual-input, dual-output current mirror amplifiers similar to DCMA1, DCMA2 and DCMA3, but constructed using n-channel IGFETs rather than p-channel IGFETs, are further embodiments of the invention.

What is claimed is:

1. A current mirror amplifier comprising:
   first and second and third and fourth field effect transistors of the same conductivity type, each having a respective gate electrode, a respective source electrode, a respective drain electrode, and a respective channel between its source and drain electrodes that has a width-to-length ratio in prescribed proportions to the width-to-length ratios of the channels of the others of said first and second and third and fourth field effect transistors, the drain electrode of said first field effect transistor connected to the source electrode of said second field effect transistor so that identical current flows through the channels of said first and second field effect transistors, the drain electrode of said third field effect transistor connected to the source electrode of said fourth field effect transistor so that identical current flows through the channels of said third and fourth field effect transistors;
   an input terminal for receiving input current, to which input terminal the drain electrode of said second field effect transistor connects, and at which input terminal an input potential appears responsive to said input current;
   means for applying said input potential to the gate electrodes of said first and third field effect transistors;
   a first output terminal to which the drain electrode of said fourth field effect transistor connects;
   a common terminal to which the source electrodes of said first and third field effect transistors connect without substantial intervening impedance;
   an interconnection of the gate electrodes of said first and second and third and fourth field effect transistors;
   structural differences between said first and second field effect transistors which are the only means for causing the source-to-gate voltage of said first transistor to be larger in predetermined amount than the source-to-gate voltage of said second transistor in response to serial conduction of current through their respective channels; and
   structural differences between said third and fourth field effect transistors which are the only means for causing the source-to-gate voltage of said third transistor to be larger in predetermined amount than the source-to-gate voltage of said fourth transistor in response to serial conduction of current through their respective channels.

2. A current mirror amplifier as set forth in claim 1, wherein said means for applying said input potential to the gate electrodes of said first and third field effect transistors consists of a connection without substantial intervening impedance of said input terminal to said interconnection of the gate electrodes of said first and second and third and fourth field effect transistors.

3. A current mirror amplifier as set forth in claim 1, wherein said means for applying said input potential to the gate electrodes of said first and third field effect transistors comprises the source follower connection of a fifth field effect transistor of the same conductivity type as said first and second and third and fourth field effect transistors.

4. A current mirror amplifier as set forth in claim 1 further comprising:
   fifth and sixth field effect transistors of the same conductivity type as said first and second and third and fourth field effect transistors, said fifth and sixth field effect transistors having respective gate electrodes connected from said interconnection of the gate electrodes of said first and second and third and fourth field effect transistors, said fifth and sixth field effect transistors having respective channels between respective source electrodes and respective drain electrodes, the source electrode of said fifth field effect transistor connecting to said common terminal, the drain electrode of said fifth field effect transistor connecting to the source electrode of said sixth field effect transistor;
   a second output terminal to which the drain electrode of said sixth field effect transistor connects; and
   structural differences between said fifth and sixth field effect transistors for causing the source-to-gate voltage of said fifth transistor to be larger in predetermined amount than the source-to-gate voltage of said sixth transistor in response to serial conduction of current through their respective channels.

5. A current mirror amplifier as set forth in claim 4, wherein said means for applying said input potential to the gate electrodes of said first and third field effect transistors consists of a connection without substantial intervening impedance of said input terminal to said interconnection of the gate electrodes of said first and second and third and fourth field effect transistors.

6. A current mirror amplifier as set forth in claim 4, wherein said means for applying said input potential to the gate electrodes of said first and third field effect transistors comprises the source follower connection of a seventhth field effect transistor of the same conductivity type as said first and second and third and fourth and fifth and sixth field effect transistors.

7. A current mirror amplifier as set forth in claim 4, wherein the channels of said third and said fifth field effect transistors have respective width-to-length ratios that are the same.

8. A current mirror amplifier as set forth in claim 7, wherein the channels of said first and said third field effect transistors have respective width-to-length ratios that are the same.

9. A current mirror amplifier as set forth in claim 1, wherein the channels of said first and said third field effect transistors have respective width-to-length ratios that are the same.

10. A current amplifier comprising:
first and second and third and fourth field effect transistors of the same conductivity type, each having a respective gate electrode, a respective source, electrode, a respective drain electrode, and a respective channel between its source and drain electrodes that has a width-to-length ratio in prescribed proportions to the width-to-length ratios of the channels of the others of said first and second and third and fourth field effect transistors, the drain electrode of said first field effect transistor connected to the source electrode of said second field effect transistor, the drain electrode of said third field effect transistor connected to the source electrode of said fourth field effect transistor;
an input terminal for receiving input current, to which input terminal the drain electrode of said second field effect transistor connects, and at which input terminal an input potential appears responsive to said input current;
means for applying said input potential to the gate electrodes of said first and third field effect transistors;
a first output terminal to which the drain electrode of said fourth field effect transistor connects;
a common terminal to which the source electrodes of said first and third field effect transistors connect without substantial intervening impedance;
an interconnection of the gate electrodes of said first and second and third and fourth field effect transistors;
structural differences between said first and second field effect transistors for causing the source-to-gate voltage of said first transistor to be larger in predetermined amount than the source-to-gate voltage of said second transistor in response to serial conduction of current through their respective channels, which structural differences comprise regions of semiconductor in which the channels of the first and second field effect transistors are respectively formed being differently doped so as to cause the barrier height of the first field effect transistor to exceed that of the second field effect transistor; and
structural differences between said third and fourth field effect transistors for causing the source-to-gate voltage of said third transistor to be larger in predetermined amount than the source-to-gate voltage of said fourth transistor in response to serial conduction of current through their respective channels, which structural differences comprise regions of semiconductor in which the channels of the third and fourth field effect transistors are respectively formed are differently doped so as to cause the barrier height of the third field effect transistor to exceed that the fourth field effect transistor.

11. A current mirror amplifier as set forth in claim 1, wherein the width-to-length ratio of the channel of said second field effect transistor is larger than the width-to-length ratio of the channel of said first field effect transistor by a factor m larger than unity, and wherein the width-to-length ratio of the channel of said fourth field effect transistor is larger than the width-to-length ratio of the channel of said third field effect transistor by said factor m.

12. A current minor amplifier comprising:
first and second and third and fourth field effect transistors of the same conductivity type, each having a respective gate electrode over a respective region of semiconductor of a prescribed doping, a respective source electrode, a respective drain electrode, and a respective channel between its source and drain electrodes, the channels of said third and fourth field effect transistors having the same width-to-length ratio which is n times that of the channels of said first and second field effect transistors, n being a positive number, the drain electrode of said first field effect transistor connected to the source electrode of said second field effect transistor, the drain electrode of said third field effect transistor connected to the source electrode of said fourth field effect transistor, regions of semiconductor in which the channels of the first and second field effect transistors are respectively formed being differently doped so as to cause the barrier height of the first field effect transistor to exceed that of the second field effect transistor by a prescribed amount, and regions of semiconductor in which the channels of the third and fourth field effect transistors are formed being differently doped so as to cause the barrier height of the third field effect transistor to exceed that of the fourth field effect transistor by said prescribed amount;
an input terminal for receiving input current, to which input terminal the drain electrode of said second field effect transistor connects, and at which input terminal an input potential appears responsive to said input current;
means for applying said input potential to the gate electrodes of said first and third field effect transistors;
a first output terminal to which the drain electrode of said fourth field effect transistor connects;
a common terminal to which the source electrodes of said first and third field effect transistors connect without substantial intervening impedance; and an interconnection of the gate electrodes of said first and second and third and fourth field effect transistors.

13. A current mirror amplifier as set forth in claim 12, wherein said means for applying said input potential to the gate electrodes of said first and third field effect transistors consists of a connection without substantial intervening impedance of said input terminal to said interconnection of the gate electrodes of said first and second and third and fourth field effect transistors.

14. A current mirror amplifier as set forth in claim 12, wherein said means for applying said input potential to the gate electrodes of said first and third field effect transistors comprises the source follower connection of a fifth field effect transistor of the same conductivity type as said first and second and third and fourth field effect transistors.

15. A current mirror amplifier as set forth in claim 12 further comprising:

fifth and sixth field effect transistors of the same conductivity type as said first and second and third and fourth field effect transistors, said fifth and sixth field effect transistors having respective gate electrodes connected from said interconnection of the gate electrodes of said first and second and third and fourth field effect transistors, said fifth and sixth field effect transistors having respective channels between respective source electrodes and respective drain electrodes, the source electrode of said fifth field effect transistor connecting to said common terminal, the drain electrode of said fifth field effect transistor connecting to the source electrode of said sixth field effect transistor, regions of semiconductor in which the channels of the fifth and sixth field effect transistors are formed being differently doped so as to cause the barrier height of the fifth field effect transistor to exceed that of the sixth field effect transistor by said prescribed amount; and a second output terminal to which the drain electrode of said sixth field effect transistor connects.

16. A current mirror amplifier as set forth in claim 15 wherein, wherein the channels of said fifth and sixth field effect transistors have the same width-to-length ratio which is p times that of the channels of said first and second field effect transistors.

17. A current mirror amplifier as set forth in claim 16 wherein p equals n.

18. A current mirror amplifier as set forth in claim 17, wherein n and p are each one.

19. A current mirror amplifier as set forth in claim 12, wherein the channels of said first and said third field effect transistors have respective width-to-length ratios that are the same.

20. A current mirror amplifier comprising:

first and second and third and fourth field effect transistors of the same conductivity type, each having a respective gate electrode, a respective source electrode, a respective drain electrode, and a respective channel between its source and drain electrodes that is formed in a region of semiconductor of the same prescribed doping as the others of said first and second and third and fourth field effect transistors, the drain electrode of said first field effect transistor connected to the source electrode of said second field effect transistor so that identical current flows through the channels of said first and second field effect transistors, the drain electrode of said third field effect transistor connected to the source electrode of said fourth field effect transistor so that identical current flows through the channels of said third and fourth field effect transistors;

an input terminal for receiving input current, to which input terminal the drain electrode of said second field effect transistor connects, and at which input terminal an input potential appears responsive to said input current;

means for applying said input potential to the gate electrodes of said first and third field effect transistors;

a first output terminal to which the drain electrode of said fourth field effect transistor connects;

a common terminal to which the source electrodes of said first and third field effect transistors connect without substantial intervening impedance; and an interconnection of the gate electrodes of said first and second and third and fourth field effect transistors, the width-to-length ratio of the channel of said second field effect transistor being larger than the width-to-length ratio of the channel of said first field effect transistor by a factor m larger than unity, and the width-to-length ratio of the channel of said fourth field effect transistor being larger than the width-to-length ratio of the channel of said third field effect transistor by said factor m.

21. A current minor amplifier as set forth in claim 20, wherein said means for applying said input potential to the gate electrodes of said first and third field effect transistors consists of a connection without substantial intervening impedance of said input terminal to said interconnection of the gate electrodes of said first and second and third and fourth field effect transistors.

22. A current mirror amplifier as set forth in claim 21, wherein the channels of said first and said third field effect transistors have width-to-length ratios that are the same.

23. A current mirror amplifier as set forth in claim 20, wherein said means for applying said input potential to the gate electrodes of said first and third field effect transistors comprises the source follower connection of a fifth field effect transistor of the same conductivity type as said first and second and third and fourth field effect transistors.

24. A current mirror amplifier as set forth in claim 23, wherein the channels of said first and said third field effect transistors have width-to-length ratios that are the same.

25. A current mirror amplifier as set forth in claim 20 further comprising:

fifth and sixth field effect transistors of the same conductivity type as said first and second and third and fourth field effect transistors, said fifth and sixth field effect transistors having respective gate electrodes connected from said interconnection of the gate electrodes of said first and second and third and fourth field effect transistors, said fifth and sixth field effect transistors having respective channels between respective source electrodes and respective drain electrodes, the source electrode of said fifth field effect transistor connecting to said common terminal, the drain electrode of said fifth field effect transistor connecting to the source electrode of said sixth field effect transistor, the width-to-length ratio of the channel of said sixth field effect transistor being larger than the width-tolength ratio of the channel of said fifth field effect transistor by said factor m; and a second output terminal to which the drain electrode of said sixth field effect transistor connects.

26. A current mirror amplifier as set forth in claim 25, wherein the channels of said first, said third and said fifth field effect transistors have respective width-to-length ratios that are the same.

27. A current mirror amplifier as set forth in claim 20, wherein the channels of said first and said third field effect transistors have respective width-to-length ratios that are the same.

28. A current amplifier comprising:

first and second and third and fourth and fifth field effect transistors of the same conductivity type, each having a respective gate electrode, a respective source electrode, a respective drain electrode, and a respective channel between its source and drain electrodes that a width-to-length ratio in prescribed proportions to the width-to-length ratios of the channels of the others of said first and second third and fourth field effect transistors, the drain electrode of said first field effect transistor connected to the source electrode of said second field transistor, the drain electrode of said third field effect transistor connector to the source electrode of said fourth field effect transistor;

an input terminal for receiving input current, to which input terminal the drain electrode of said second field effect transistor connects, and at which input terminal an input potential appears responsive to said input current;

means for applying said input potential to the gate electrodes of said first and third field effect transistors;

a first output terminal to which the drain electrode of said fourth field effect transistor connects;

a common terminal to which the source electrodes of said first and third and fifth field effect transistors connect without substantial intervening impedance;

a bias terminal for receiving a bias current of the same polarity as said input current, to which bias terminal the drain electrode of said fifth field effect transistor connects, a potential appearing at said bias terminal responsive to said bias current and being applied to an interconnection of the gate electrodes of said second and fourth and fifth field effect transistors;

structural differences between said first and second field effect transistors for causing the source-to-gate voltage of said first transistor to be larger in predetermined amount than the source-to-gate voltage of said second transistor in response to serial conduction of current through their respective channels, which structural differences comprise regions of semiconductor in which the channels of the first and second field effect transistors are respectively formed being differently doped so as to cause the barrier height of the first field effect transistor to exceed that of the second field effect transistor;

structural differences between said third and fourth field effect transistors for causing the source-to-gate voltage of said third transistor to be larger in predetermined amount than the source-to-gate voltage of said fourth transistor response to serial conduction of current through their respective channels, which structural differences comprise regions of semiconductor in which the channels of the third and fourth field effect transistors are respectively formed being differently doped so as to cause the barrier height of the third field effect transistor to exceed that of the fourth field effect transistor; and a region of semiconductor in which the channel of said fifth field effect transistor is formed, said regions of semiconductor in which the channels of the first and third and fifth field effect transistors are respectively formed being doped similarly to each other.

29. A current mirror amplifier as set forth in claim 28, wherein said means for applying said input potential to the gate electrodes of said first and third field effect transistors consists of a connection without substantial intervening impedance of said input terminal to said interconnection of the gate electrodes of said first and third field effect transistors.

30. A current mirror amplifier as set forth in claim 28, wherein the width-to-length ratio of the channel of said second field effect transistor is larger than the width-to-length ratio of the channel of said first field effect transistor by a factor m larger than unity, and wherein the width-to-length ratio of the channel of said fourth field effect transistor is larger than the width-to-length ratio of the channel of said third field effect transistor by said factor m.

31. A current mirror amplifier comprising:

first and second and third and fourth field effect transistors of the same conductivity type, each having a respective gate electrode over a respective region of semiconductor of a prescribed doping, a respective source electrode, a respective drain electrode, and a respective channel between its source and drain electrodes, the channels of said third and fourth field effect transistors having the same width-to-length ratio which is n times that of the channels of said first and second field effect transistors, n being a positive number, the drain electrode of said first field effect transistor connected to the source electrode of said second field effect transistor so that identical current flows through the channels of said first and second field effect transistors, the drain electrode of said third field effect transistor connected to the source electrode of said fourth field effect transistor so that identical current flows through the channels of said third and fourth field effect transistors, regions of semiconductor in which the channels of the first and second field effect transistors are respectively formed being differently doped so as to cause the barrier height of the first field effect transistor to exceed that of the second field effect transistor by a prescribed amount, and regions of semiconductor in which the channels of the third and fourth field effect transistors are formed being differently doped so as to cause the barrier height of the third field effect transistor to exceed that of the fourth field effect transistor by said prescribed amount;

an input terminal for receiving input current, to which input terminal the drain electrode of said second field effect transistor connects, and at which input terminal an input potential appears responsive to said input current;

means for applying said input potential to the gate electrodes of said first and third field effect transistors;

a first output terminal to which the drain electrode of said fourth field effect transistor connects;

a common terminal to which the source electrodes of said first and third field effect transistors connect without substantial intervening impedance; and an interconnection of the gate electrodes of said first and second and third and fourth field effect transistors.

32. A current mirror amplifier as set forth in claim 31, wherein said means for applying said input potential to the gate electrodes of said first and third field effect transistors consists of a connection without substantial intervening impedance of said input terminal to said interconnection of the gate electrodes of said first and second and third and fourth field effect transistors.

33. A current mirror amplifier as set forth in claim 31, wherein said means for applying said input potential to the gate electrodes of said first and third field effect transistors comprises the source follower connection of a fifth field effect transistor of the same conductivity type as said first and second and third and fourth field effect transistors.

34. A current mirror amplifier as set forth in claim 31 further comprising:

fifth and sixth field effect transistors of the same conductivity type as said first and second and third and fourth field effect transistors, said fifth and sixth field effect transistors having respective gate electrodes connected from said interconnection of the gate electrodes of said first and second and third and fourth field effect transistors, said fifth and sixth field effect transistors having respective channels between respective source electrodes and respective drain electrodes, the source electrode of said fifth field effect transistor connecting to said common terminal, the drain electrode of said fifth field effect transistor connecting to the source electrode of said sixth field effect transistor, regions of semiconductor in which the channels of the fifth and sixth field effect transistors are formed being differently doped so as to cause the barrier height of the fifth field effect transistor to exceed that of the sixth field effect transistor by said prescribed amount; and a second output terminal to which the drain electrode of said sixth field effect transistor connects.

35. A current mirror amplifier as set forth in claim 34, wherein the channels of said fifth and sixth field effect transistors have the same width-to-length ratio which is p times that of the channels of said first and second field effect transistors.

* * * * *